United States Patent
Ono et al.

(10) Patent No.: US 7,637,997 B2
(45) Date of Patent: Dec. 29, 2009

(54) SILICON WAFER, METHOD FOR PRODUCING SILICON WAFER AND METHOD FOR GROWING SILICON SINGLE CRYSTAL

(75) Inventors: Toshiaki Ono, Saga (JP); Wataru Sugimura, Saga (JP); Masataka Hourai, Saga (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/439,486

(22) Filed: May 22, 2006

(65) Prior Publication Data

US 2006/0266278 A1 Nov. 30, 2006

(30) Foreign Application Priority Data

May 25, 2005 (JP) ............................. 2005-152054
Jul. 13, 2005 (JP) ............................. 2005-204279

(51) Int. Cl.
  *C30B 15/20* (2006.01)
(52) U.S. Cl. .................. 117/15; 117/2; 117/13; 117/19; 257/610; 423/324; 423/325; 438/460; 438/509
(58) Field of Classification Search .......... 117/89, 117/19, 20, 13, 1, 2, 15, 30, 43; 257/1, 607, 257/610, 611; 428/641, 446, 447, 668, 930; 438/460, 959, 974, 509; 423/324, 325, 348
See application file for complete search history.

(56) References Cited

U.S. PATENT DOCUMENTS

| | | | | |
|---|---|---|---|---|
| 5,340,434 A | * | 8/1994 | Takano et al. ............. | 117/21 |
| 5,373,804 A | * | 12/1994 | Tachimori et al. ......... | 117/13 |
| 5,954,873 A | * | 9/1999 | Hourai et al. .............. | 117/13 |
| 6,113,687 A | * | 9/2000 | Horai et al. ................ | 117/20 |
| 6,245,430 B1 | * | 6/2001 | Hourai et al. .............. | 428/450 |
| 6,261,362 B1 | * | 7/2001 | Fujikawa et al. ........... | 117/20 |
| 6,277,501 B1 | * | 8/2001 | Fujikawa .................. | 428/641 |
| 6,338,757 B1 | * | 1/2002 | Nishimoto et al. ......... | 117/218 |
| 6,547,875 B1 | * | 4/2003 | Nakajima et al. .......... | 117/13 |
| 6,548,886 B1 | * | 4/2003 | Ikari et al. ................ | 257/610 |
| 6,599,360 B2 | * | 7/2003 | Iida et al. ................. | 117/19 |
| 6,641,888 B2 | * | 11/2003 | Asayama et al. .......... | 428/64.1 |
| 6,720,237 B2 | * | 4/2004 | Iwasaki et al. ............ | 438/458 |

(Continued)

FOREIGN PATENT DOCUMENTS

JP    61-227986    10/1986

(Continued)

OTHER PUBLICATIONS

Korean Office Action issued in connection with Korean Patent Application No. 2006-44933, Mar. 27, 2007.

(Continued)

*Primary Examiner*—Steven P Griffin
*Assistant Examiner*—Seyed Masoud Malekzadeh
(74) *Attorney, Agent, or Firm*—Kolisch Hartwell, P.C.

(57) ABSTRACT

A silicon single crystal is grown by the CZ method. A silicon melt from which the crystal is grown is added with dopant such that the crystal has a resistivity of 0.025 to 0.08 Ωcm. As well as the dopant, carbon is added to the silicon melt. The crystal is pulled in a hydrogen-bearing inert atmosphere.

21 Claims, 8 Drawing Sheets

U.S. PATENT DOCUMENTS

| | | | | |
|---|---|---|---|---|
| 6,753,955 | B2* | 6/2004 | Yagi | 356/237.3 |
| 6,802,899 | B1* | 10/2004 | Tamatsuka | 117/13 |
| 6,905,771 | B2* | 6/2005 | Ono et al. | 428/446 |
| RE39,173 | E* | 7/2006 | Hourai et al. | 428/450 |
| 7,083,677 | B2* | 8/2006 | Watanabe | 117/13 |
| 7,229,501 | B2* | 6/2007 | Takeno | 117/95 |
| 2001/0023941 | A1* | 9/2001 | Ammon et al. | 257/1 |
| 2001/0029883 | A1* | 10/2001 | Minami et al. | 117/20 |
| 2002/0167661 | A1* | 11/2002 | Yagi | 356/237.3 |
| 2003/0008447 | A1* | 1/2003 | Asayama et al. | 438/200 |
| 2003/0106484 | A1* | 6/2003 | Fusegawa et al. | 117/19 |
| 2003/0157341 | A1* | 8/2003 | Ikezawa et al. | 428/446 |
| 2003/0175532 | A1* | 9/2003 | Asayama et al. | 428/446 |
| 2004/0089225 | A1* | 5/2004 | Ono et al. | 117/19 |
| 2004/0194692 | A1* | 10/2004 | Nishikawa et al. | 117/84 |
| 2004/0216659 | A1* | 11/2004 | Asayama et al. | 117/2 |
| 2005/0014347 | A1* | 1/2005 | Tomita et al. | 438/459 |
| 2005/0076826 | A1* | 4/2005 | Watanabe | 117/13 |
| 2005/0087830 | A1* | 4/2005 | Takeno | 257/487 |
| 2005/0090079 | A1* | 4/2005 | Yoshida | 438/473 |
| 2005/0103256 | A1* | 5/2005 | Sadamitsu et al. | 117/20 |
| 2006/0065184 | A1* | 3/2006 | Sakurada et al. | 117/19 |
| 2006/0086313 | A1* | 4/2006 | Sakurada | 117/89 |
| 2006/0156969 | A1* | 7/2006 | Hourai et al. | 117/89 |
| 2007/0017436 | A1* | 1/2007 | Ono et al. | 117/20 |

FOREIGN PATENT DOCUMENTS

| | | |
|---|---|---|
| JP | 2004-165489 | 6/2004 |
| JP | 2004-182525 | 7/2004 |
| KR | 2002-24370 | 3/2002 |

OTHER PUBLICATIONS

English language translation of Korean Office Action issued in connection with Korean Patent Application No. 2006-44933, Mar. 27, 2007.

Japan Patent Office (Teruma Ayusawa, examiner), "Notice for Reasons for Rejection" for Japanese application No. 2005-204279, mailing date Aug. 25, 2009 (6 pages). JP2005-204279 is a foreign counterpart of U.S. Appl. No. 11/439,486. Disclosure includes applicant's English translation.

* cited by examiner

SILICON WAFER, METHOD FOR PRODUCING SILICON WAFER AND METHOD FOR GROWING SILICON SINGLE CRYSTAL

BACKGROUND OF THE INVENTION

1. Field of the Invention

The invention relates to a silicon wafer as a raw material of semiconductor devices and a method for producing the same. The invention also relates to a method for growing a silicon single crystal. Particularly, the invention relates to a technology which can provide a silicon wafer in which generation of epitaxial defects is suppressed to a lower number during growth of an epitaxial layer on the wafer.

Priority is claimed on Japanese Patent Application No. 2005-152054 filed May 25, 2005 and Japanese Patent Application No. 2005-204279 filed Jul. 13, 2005, the contents of which are incorporated herein by reference.

2. Description of Related Art

Conventionally, by performing high temperature heat treatment of a p+ type silicon single crystal having resistivity of 0.025 to 0.008 Ω cm, ring likely distributed oxidation-induced stacking faults (ring-OSFs) have been known to occur within the crystal (M. Suhren et al., High Purity Silicon IV, p132, Electrochemical Society, 1996). OSF nuclei are large sized oxide precipitation nuclei which are formed during crystal growth.

Recent studies illuminated generation of epitaxial defects at the corresponding position of ring-OSFs in a p/p+ type wafer comprising an epitaxial layer grown on a p+ type wafer comprising ring-OSFs. Since the epitaxial layer is an active layer for a device, epitaxial defects such as stacking faults and dislocations in the epitaxial layer cause failure of device operation, and result in decreasing yield.

As a conventional solution to the above-described problems, Japanese Patent Application, First Publication No. 2004-165489 (Patent Reference 1) describes a technique in which an epitaxial layer is grown on a wafer sliced from a defect-free crystal in which a ring-like OSF developing region is degenerated in the central portion of the crystal. The OSF developing region is a region at which the ring-OSFs are generated in the crystal during high temperature oxidation.

However, a low pulling rate of a crystal has been required for degenerating the ring-like OSF developing region. Therefore, the technique described in Patent Reference 1 includes a problem of reduced productivity in the manufacturing process of single crystals. In addition, since an extremely narrow range is allowed for rates of pulling defect-free crystals, precise controllability is required to pull a single crystal while controlling the pulling rate within the pulling rate range of defect-free crystals.

An object of the invention is to provide a method for growing a silicon single crystal which is, without reducing productivity, capable of providing a silicon wafer which has a resistivity of 0.025 to 0.008 Ω cm and generates only small numbers of epitaxial defects when an epitaxial layer is grown on the wafer.

The other object of the invention is to provide a silicon wafer of high quality and method for producing the same. The silicon wafer is sliced from the single crystal which is grown by the above-described method for growing a silicon single crystal.

Based on the consideration of the above-described problem on epitaxial defects in p/p+ wafer, an object of the invention is to provide an epitaxial wafer which is produced from a silicon single crystal having a resistivity of 0.025 to 0.008 Ωcm, but is free from generation of epitaxial defects, has a homogeneous in-plane distribution of oxide precipitate density, and has excellent intrinsic gettering property.

SUMMARY OF THE INVENTION

A method for growing a silicon single crystal of the invention is a method for growing a silicon single crystal by the Czochralski method (CZ method), comprising: adding (doping) hydrogen to an inert atmosphere in which a silicon single crystal is grown; adding (doping) dopant to silicon melt such that the silicon single crystal which is pulled from the silicon melt has a resistivity of 0.025 to 0.008 Ω cm; and pulling the silicon single crystal from the silicon melt.

The method has an object to grow a p+ type silicon single crystal having a resistivity (electric resistivity) of 0.025 to 0.008 Ω cm, because such properties are essential for silicon wafers for providing semiconductor devices of high speed, high performance, and high density.

In the above-described method for growing a silicon single crystal, the silicon single crystal is pulled in a hydrogen-bearing inert atmosphere (inert atmosphere containing hydrogen). As a result, the silicon single crystal has an extremely narrow width of ring-OSF region (ring-like OSF developing region) compared with a silicon single crystal grown in a hydrogen-free inert atmosphere. Since epitaxial defects are mainly generated in the ring-OSF region in a wafer, an extremely narrow width of the ring-OSF region results in restricting the generation of epitaxial defects only in a narrow portion in the wafer. Therefore, by pulling a silicon single crystal in a hydrogen-bearing inert atmosphere, it is possible to provide a silicon single crystal from which excellent silicon wafers having epitaxial defects in small numbers can be obtained.

In the above description, the width of the ring-OSF region is the difference between the inside radius and external radius of the ring-OSF region.

In addition, by the above-described method for growing a silicon single crystal, it is possible to make the ring-OSF region within the silicon single crystal to have an extremely narrow width. Therefore, it is possible to expand the pulling rate range for growing a silicon single crystal having desired properties, and enhance productivity in the manufacturing process of crystals.

A method for growing a silicon single crystal of the invention is a method for growing a silicon single crystal by the CZ method, including: adding dopant to a silicon melt such that a silicon single crystal which is pulled from the silicon melt has a resistivity of 0.025 to 0.008 Ω cm; adding (doping) carbon to the silicon melt; and pulling a silicon single crystal from the silicon melt.

In the above-described method for growing a silicon single crystal, the silicon single crystal is pulled from a silicon melt added (doped) with carbon. When an epitaxial layer is formed on a wafer obtained from the single crystal, the wafer is reduced in numbers of epitaxial defects compared with the wafer obtained from a single crystal pulled without adding carbon. Therefore, by the above-described method, it is possible to provide a silicon single crystal capable of providing excellent silicon wafers in which epitaxial defects are reduced in numbers.

In the above-described method for growing a silicon single crystal, it is possible to reduce epitaxial defects in numbers in a portion corresponding to the location of ring-OSF region. Therefore, it is possible to expand a pulling rate range of the silicon single crystal and enhance productivity of single crystals without reducing the quality of silicon wafers which are obtained from the silicon single crystals.

A method for growing a silicon single crystal of the invention is a method for growing a silicon single crystal by the CZ method, including: adding hydrogen into an inert atmosphere in which a silicon single crystal is grown; adding dopant to a silicon melt such that the silicon single crystal which is pulled from the silicon melt has a resistivity of 0.025 to 0.008 Ω cm; adding carbon to the silicon melt; and pulling a silicon single crystal from the silicon melt.

In such a method for growing a silicon single crystal, a silicon single crystal is pulled from a silicon melt added with carbon in a hydrogen-bearing inert atmosphere. Therefore, a multiplier effect can be obtained by significantly narrowing the width of ring-OSF region, and by reducing the epitaxial defects in a wafer obtained from the silicon single crystal, at a portion corresponding to the position of the ring-OSF region.

Accordingly, it is possible to provide a silicon single crystal which is capable of providing an excellent wafer having very few epitaxial defects. In addition, the pulling rate range for pulling the silicon single crystal is further expanded and productivity in the manufacturing process of the crystal production is further enhanced.

In the above-described method for growing a silicon single crystal, it is possible to control an amount of hydrogen which is added to the inert atmosphere to be within a range of 3 to 20% by volume.

The width of the ring-OSF region cannot be narrowed effectively, and the critical pulling rate cannot be increased effectively by the insufficient addition of hydrogen. On the other hand, too much addition of hydrogen generates a risk of combustion or detonation in the case of the occurrence of leakage of air into the furnace. Hence, the upper limit and the lower limit is defined for the amount of hydrogen added. The lower limit in the amount of added hydrogen is preferably not less than 0.1% by volume, and more preferably not less than 3% by volume. By the addition of hydrogen at less than 0.1%, substantially no effect can be observed for narrowing the width of the ring-OSF region. By the addition of hydrogen at not less than 0.1% and less than 3%, effect of narrowing width of the ring-OSF region can be observed to some extent, but the effect is still insufficient. The amount of hydrogen added is preferably not more than 20% by volume. A hydrogen concentration or a hydrogen-equivalent concentration in excess of 50% (that is, a hydrogen partial pressure of 6.75 kPa) is undesirable for safety reasons. At such a concentration, there is a high risk of detonation by oxygen leakage into the CZ furnace. A hydrogen concentration or a hydrogen-equivalent concentration in excess of 20% (hydrogen partial pressure=2.7 kPa) is not preferable. At such concentrations, even though detonation does not occur, there is still a high risk of combustion. The safety hazard can be avoided at a hydrogen concentration of not more than 20% by volume. At such a hydrogen concentration, even when combustion occurs within the furnace due to leakage of oxygen or the like, fluctuation of the atmospheric pressure at the time of combustion does not exceed 1 atmosphere. Thus, the hydrogen-equivalent concentration of the hydrogen-bearing substance (e.g. hydrogen gas) is preferably not less than 3% and not more than 20%, and more preferably in a range of 3 to 10%.

The atmosphere in which the silicon single crystal is grown may be a hydrogen-bearing atmosphere composed of an inert gas containing hydrogen. A concentration of the hydrogen bearing substance within the hydrogen-bearing atmosphere may be controlled such that the hydrogen-equivalent concentration of the substance is not less than 3% and not more than 20% by volume.

When hydrogen gas is used as the hydrogen-bearing substance, the concentration of hydrogen in the hydrogen-bearing atmosphere is preferably not lower than 3% and not higher than 20% by volume.

Here, the hydrogen-bearing substance is a substance which includes hydrogen atoms in the molecular structure. In addition, the hydrogen-bearing substance which is used in the invention is a substance which is capable of dissolving and decomposing in the silicon melt to provide the silicon melt with hydrogen atoms.

The hydrogen-bearing substance may include hydrogen gas. By mixing the hydrogen-bearing substance in an inert gas and by introducing the mixed gas into the atmosphere in which a silicon single crystal is grown, it is possible to increase the concentration of hydrogen within the silicon melt. Specific examples of the hydrogen-bearing substance include hydrogen gas, inorganic compounds containing hydrogen atoms such as $H_2O$ and HCl, silane gas, hydrocarbons such as $CH_4$ and $C_2H_2$, and organic compounds containing hydrogen such as alcohols and carboxylic acids. It is preferable to use hydrogen gas as the hydrogen-bearing substance. The inert gas may be preferably inexpensive argon gas, although various other rare gases such as helium, neon, krypton and xenon may be used singly or in admixture.

The concentration of the hydrogen-bearing substance in the hydrogen-bearing atmosphere may be not less than 3% and not more than 20% by volume based on the hydrogen-equivalent concentration. The hydrogen-equivalent concentration is used because of the following reason. The amount of hydrogen atoms provided by thermal decomposition of the hydrogen-bearing substance is dependent on the numbers of hydrogen atoms originally contained in the hydrogen-bearing substance. For example, 1 mole of $H_2O$ contains 1 mole of $H_2$, whereas 1 mole of HCl contains only 0.5 mole of $H_2$. In the present invention, a standard for hydrogen-bearing atmosphere is obtained by introducing hydrogen gas into an inert gas such that the concentration of hydrogen gas is 3 to 20% by volume. It is preferable to control the concentration of the hydrogen-bearing substance so as to obtain an atmosphere equivalent to the standard atmosphere. At that time, the preferable concentration of the hydrogen-bearing substance expressed by the hydrogen-equivalent concentration is not less than 3% and not more than 20% by volume.

That is, assuming that the hydrogen-bearing substance dissolves in the silicon melt, thermally decomposes in the high temperature silicon melt and provides hydrogen atoms, the addition of the hydrogen-bearing substance is controlled so that the hydrogen-equivalent concentration in the atmosphere after the decomposition falls within 3 to 20% by volume.

In the method for producing a silicon single crystal of the invention, a silicon single crystal is grown in a hydrogen-bearing atmosphere composed of an inert gas that includes a hydrogen-bearing substance of 3 to 20% by volume in hydrogen-equivalent concentration. The hydrogen atoms from the hydrogen-bearing substance dissolve in the silicon melt and are taken up within the silicon lattice during solidification of the silicon.

When oxygen gas ($O_2$) is contained in the inert atmosphere, the difference between the twice the oxygen gas concentration and hydrogen-equivalent concentration of the gaseous hydrogen-bearing substance is set to be not less than 3% by volume. If the difference between twice the oxygen gas concentration and hydrogen-equivalent concentration of the hydrogen-bearing substance is less than 3% by volume, the hydrogen atoms incorporated into the silicon crystal will not provide an effect for inhibiting generation of grown-in defects such as COPs and dislocation clusters.

If nitrogen is present as an impurity in the inert gas at a high concentration, dislocations may occur in the silicon crystal. Therefore, under usual conditions of atmospheric pressure of 1.3 to 13.3 kPa (10 to 100 torr) within the furnace, it is preferable to set the nitrogen concentration to be not more than 20% by volume.

Hydrogen gas can be supplied to the CZ furnace as the hydrogen-bearing substance by being fed into the crystal pulling furnace through a specialized line from a commercial hydrogen gas cylinder, a hydrogen gas storage tank, or a hydrogen tank that stores hydrogen in a hydrogen occlusion alloy.

In the method for growing a silicon single crystal, carbon may be added to the silicon melt so that the concentration of carbon in the silicon single crystal is $5\times10^{15}$ to $5\times10^{17}$ atoms/cm$^3$ (ASTM F123-1981). The carbon concentration of less than $5\times10^{15}$ atoms/cm$^3$ may be insufficient for providing an effect for reducing epitaxial defects at a portion corresponding to the position of the ring-OSF region. A carbon content in excess of $5\times10^{17}$ atoms/cm$^3$ is not preferable because of a possible occurrence of dislocations within the silicon single crystal during the growth process.

By adding a carbon dopant so as to confirm the carbon concentration in the crystal to be $5\times10^{15}$ to $5\times10^{17}$ atoms/cm$^3$ (ASTM F123-1981), it is possible to provide a silicon single crystal from which excellent silicon wafers can be obtained. In such silicon wafers, occurrence of epitaxial defects is further reduced in numbers at a portion corresponding to the position of the ring-OSF region. In addition, since the pulling rate range for pulling the silicon single crystal can be further expanded, productivity in the manufacturing process of crystals is further enhanced.

Preferably, the carbon concentration in the silicon single crystal may be $8\times10^{15}$ to $2\times10^{17}$ atoms/cm$^3$ (ASTM F123-1981).

In the above-described method for growing a silicon single crystal, the above-described resistivity of the crystal may be achieved by adding boron (B) as the dopant.

By such a method for growing a silicon single crystal, it is possible to grow easily a p$^+$ silicon single crystal having a resistivity of 0.025 to 0.008 Ω cm.

In order to solve the above-described problem, a silicon wafer of the invention is sliced from a single crystal which has been grown by any one of the above-described methods for growing a silicon single crystal.

Such a silicon wafer is extremely reduced in epitaxial defects in numbers and is of high quality and less expensive.

A silicon wafer of the invention may be formed by growing an epitaxial layer on the above-described silicon wafer. The epitaxial layer may be a silicon epitaxial layer.

In the above described silicon wafer, oxygen concentration may be controlled to be within the range of $1.0\times10^{18}$ to $1.4\times10^{18}$ atoms/cm$^3$ (ASTM F121-1979).

Such a silicon wafer is capable of providing sufficient density of oxide precipitates for assuring sufficient gettering ability. In addition, in such a high quality wafer, sufficient strength is confirmed.

In order to solve the above-described problem, a method for producing a silicon wafer of the invention comprises: slicing a silicon wafer from a silicon single crystal which has been grown by any one of the above-described methods for growing a silicon single crystal; performing an annealing of the silicon wafer at a temperature of 700 to 900° C. for 30 minutes to 4 hours; after the annealing of the wafer, perform-ing polishing of a surface of the silicon wafer; and after the polishing of the wafer, growing an epitaxial layer on the surface of the silicon wafer. In the above-described method for producing a silicon wafer, the epitaxial layer which is grown on the surface of the silicon wafer may be a silicon epitaxial layer.

In such a method for producing a silicon wafer, since the method comprises annealing of the silicon wafer at a temperature of 700 to 900° C. for a time of 30 minutes to 4 hours, it is possible to provide the silicon wafer with an intrinsic gettering effect (IG effect). Without the annealing, small-sized oxide precipitates disappear during a high temperature condition during the epitaxial growth of the epitaxial layer. By performing the above-described annealing, it is possible to enhance the growth of oxide precipitation nuclei having the dopant (e.g. B) in cores. Such oxide precipitation nuclei including dopant in the cores can remain after the growth of the epitaxial layer, thereby increase the density of oxide precipitates and enhance the gettering effect.

By performing the annealing of the wafer before the polishing of the wafer, it is possible to polish off scars on the wafer, which are formed by a boat for supporting the wafer.

As conditions for the annealing, an annealing temperature below 700° C. or annealing time shorter than 30 minutes are not preferable because of a possibility that oxide precipitation nuclei are not enhanced to grow and sufficient effect for enhancing the gettering effect can not be obtained. An annealing temperature exceeding 900° C. contributes to erasing of the oxide precipitation nuclei rather than enhancing the growth of the oxide precipitation nuclei. Therefore, the gettering effect cannot be enhanced at a temperature exceeding 900° C. An annealing time of longer than 4 hours is not preferable, since too much oxide precipitates are formed and tend to cause epitaxial defects. It is preferable to perform the annealing of the wafer in an oxygen gas atmosphere or in a mixed gas atmosphere composed of oxygen gas and an inert gas (Ar gas or the like).

The reason for introducing argon (Ar) gas into the CZ furnace during the crystal growth is to replace the atmosphere with an inert gas and inhibit the contamination of the crystal with impurities originated from the member of the CZ furnace. In the invention, H$_2$ gas is mixed with the Ar gas so that a proportion of the H$_2$ gas in the mixed gas is 3 to 20% by volume. By mixing H$_2$ gas at the above-described proportion, it is possible to reduce the width of the ring-OSF region to have an extremely narrow width. Therefore, it is possible to largely reduce the proportion of the ring-OSF region having a possibility of generating epitaxial defects in a device formation region of the wafer.

At the time of growing a silicon single crystal having a resistivity of 0.025 to 0.008 Ω cm, it is preferable to add carbon to the silicon melt so that the single crystal grown from the melt has a carbon concentration of $5\times10^{15}$ to $5\times10^{17}$ atoms/cm$^3$. By such addition of carbon, it is possible to reduce the epitaxial defects in a portion of the wafer corresponding to the position of the ring-OSF region.

Without a heat treatment of the wafer before the epitaxial growth of an epitaxial layer, small-sized precipitation nuclei having boron (B) in the cores disappear during the epitaxial growth process at high temperature. By performing heat treatment of the wafer at a temperature not lower than 700° C. and below 900° C. in advance of the epitaxial growth of the epitaxial layer, it is possible to enhance the growth of small-sized precipitation nuclei having boron (B) in the cores. Therefore, such small sized nuclei do not disappear and increase the density of precipitates which remain after the epitaxial growth of the epitaxial layer, thereby enhance the effect for gettering. So that scars not remain on the wafer, which are caused by a boat for supporting the wafer, it is preferable to perform the heat treatment before the mirror polishing of the wafer. The heat treatment before the epitaxial growth aims to provide the wafer with precipitates which do not tend to disappear during the epitaxial growth process. However, too long a heat treatment time, for example, longer than 4 hours is not preferable because of a tendency of causing epitaxial defects. Therefore, it is preferable to control the heat treatment time to be not longer than 4 hours.

There is a possibility of causing contamination of the wafer with a substance originated from the furnace. An oxide film formed on the wafer is effective for preventing the wafer from the contamination. Therefore, it is preferable to perform the above-described heat treatment of the wafer in a mixed gas atmosphere composed of oxygen and an inert gas. Since the heat treatment is performed before mirror polishing of the wafer, the oxide film formed during the heat treatment is polished off during the mirror polishing process. Therefore, there is no need for a specific step for removing the oxide film, such as removing oxide film with HF.

A lower limit of the oxygen concentration of the wafer is defined based on the requirement for inhibiting the reduction of strength of the wafer and for assuring a sufficient amount of oxide precipitates so as to obtain a sufficient IG effect. It is preferable to control the oxygen concentration of the wafer to be not lower than $1.0 \times 10^{18}$ atoms/cm$^3$. (ASTM F121-1979)

A silicon wafer can be prepared by slicing a wafer from the above-described silicon single crystal; polishing and cleaning the surface of the wafer; and growing an epitaxial layer on the surface of the wafer. For example, the epitaxial layer may be formed by vapor growth utilizing thermal decomposition. Any other method may be applied to the growth of the epitaxial layer provided that a defectless epitaxial layer is grown by the method.

Effect of the Invention

By the present invention, it is possible to provide a silicon single crystal which is capable of providing an excellent silicon wafer which is reduced in numbers of epitaxial defects. Moreover, by the present invention, it is possible to expand the pulling rate range of the silicon single crystal, and thereby enhance the productivity of single crystals.

DETAILED DESCRIPTION OF THE INVENTION

In the following, a first embodiment in accordance with the invention is explained with reference to the drawings.

Figure 1:
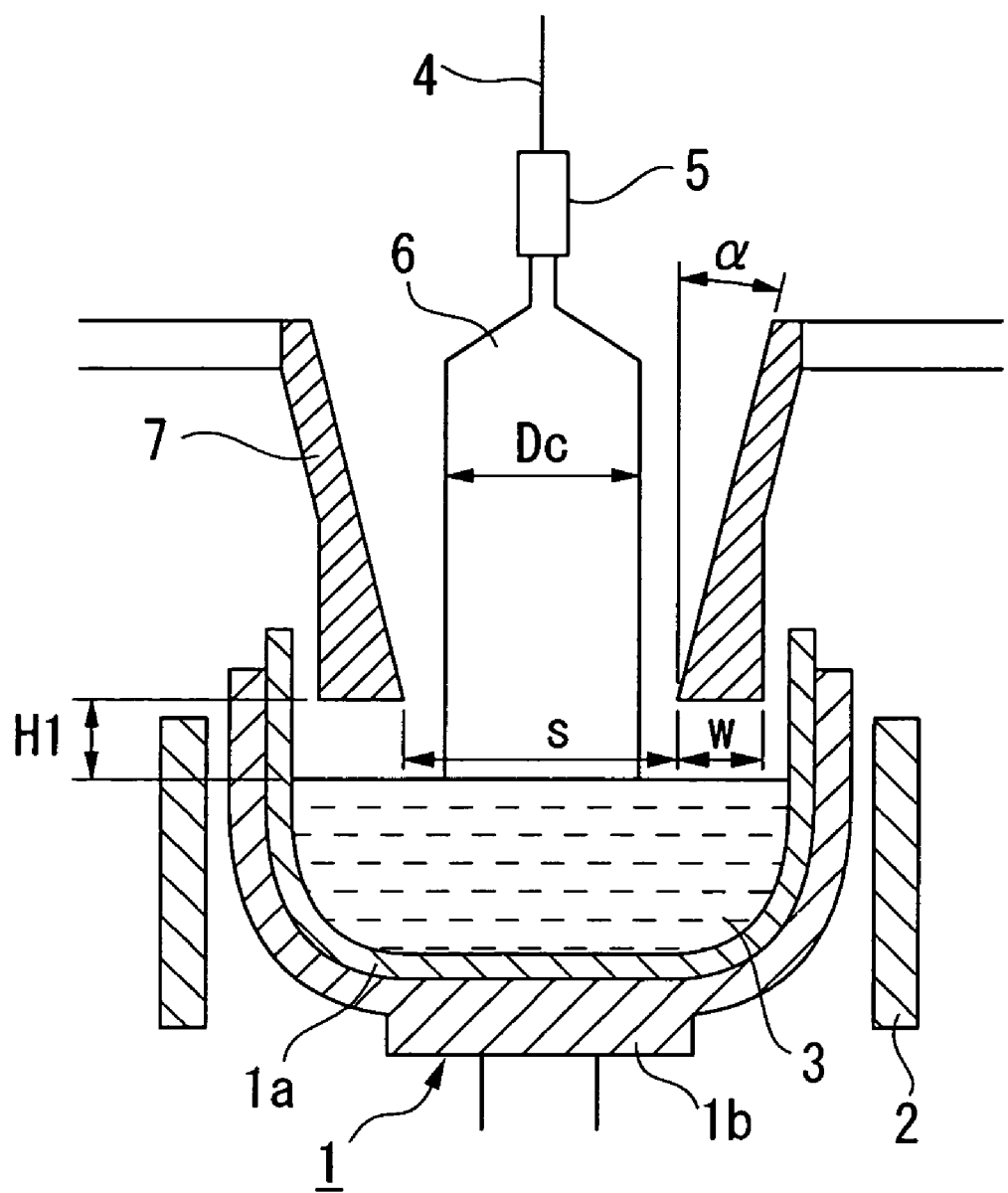
FIG. 1 is a longitudinal section of a CZ furnace which is appropriate for carrying out a production of silicon single crystals in accordance with the invention.

FIG. 1 is a longitudinal section of a CZ furnace which is appropriate for carrying out a production of silicon single crystals in accordance with the invention. The CZ furnace has a crucible 1 that is centrally located within a chamber, and a heater 2 disposed outside of the crucible 1. The crucible 1 has a double construction composed of an inner quartz crucible 1a which holds therein a raw material melt 3, and an outer graphite crucible 1b which holds the inner quartz crucible 1a. The crucible 1 is rotated and vertically driven by a supporting shaft commonly referred to as a pedestal. A cylindrical heat shield 7 is provided above the crucible 1. The heat shield 7 is composed of an outer graphite shell packed on the inside with a graphite felt. The heat shield 7 has an inner face which is tapered so that the inside radius gradually decreases from the top periphery to the bottom periphery. At the top of the heat shield 7, the outer face is a tapered surface which matches the inner face, whereas the outer face at the bottom portion is a substantially straight surface. Hence, the thickness of the heat shield 7 gradually increases in the downward direction.

This CZ furnace is capable of growing a 200 mm single crystal having a target diameter of, for example, 210 mm, and a body length of, for example, 1200 mm.

A specific example for the heat shield 7 may consist of an outside diameter for the portion entering the crucible of 470 mm, a minimum inside diameter S at the lowermost end of 270 mm, a width W in the radial direction of 100 mm, and an angle by the inside face shaped as an inverted truncated cone to the vertical direction of 21°. In addition, the crucible 1 may have an inside diameter of, for example 550 mm, and the bottom end of the heat shield 7 may have a height H from the melt surface of, for example, 60 mm.

Next, the procedure for setting the operating conditions for growing a silicon single crystal is explained.

First, the crucible is loaded with, for example, 130 kg of high-purity polycrystalline silicon, and p-type dopant (e.g., boron, aluminum, germanium) is doped in order to set the electrical resistivity of the single crystal to be 0.025 to 0.008 Ωcm.

In the present invention, it is preferable to have the wafer obtained from the single crystal to be a p$^+$ wafer. A p+ wafer is preferred because of, for example, a requirement for designing a device. For example, in so-called latch-up phenomena, floating charge which is generated during the operation of a device activates not-intended operation of a parasitic transistor. By the use of a p$^+$ wafer, it is possible to inhibit the latch-up phenomena and make the design of a device easy. In addition, in a case of using a capacitor having a trench structure, by the use of p+ wafer, it is possible to inhibit expansion of a depletion layer in the vicinity of the trench at the time of applying an electric voltage.

In the invention, it is preferable to grow a silicon single crystal such that a oxygen concentration of a wafer obtained from the silicon single crystal is within a range of $1.0 \times 10^{18}$ to $1.4 \times 10^{18}$ atoms/cm$^3$ (ASTM F121-1979).

By having such a silicon single crystal, it is possible to provide an excellent wafer having a density of oxide precipitates for assuring sufficient gettering ability and sufficient strength.

In addition, in the present embodiment, a carbon dopant is added to the silicon melt so as to obtain a silicon single crystal having a carbon concentration of $5 \times 10^{15}$ to $5 \times 10^{17}$ atoms/cm$^3$ (ASTM F123-1981). Preferably, the silicon single crystal may have a carbon concentration of $8 \times 10^{15}$ to $2 \times 10^{17}$ atoms/cm$^3$ (ASTM F123-1981).

The interior of the apparatus is controlled at an inert atmosphere of reduced pressure of 1.33 to 26.7 kPa (10 to 200 torr), and hydrogen is introduced into the furnace at the mixing ratios of 3 to 20% by volume with respect to the inert gas (e.g. argon gas). It is desirable for the pressure of the atmosphere within the furnace to be not less than 1.33 kPa (10 torr), preferably from 4 to 26.7 kPa (30 to 200 torr), and more preferably from 4.0 to 9.3 kPa (30 to 70 torr). If the partial pressure of hydrogen is low, the hydrogen concentration within the melt and the crystal will be low. The above lower limit of atmospheric pressure within the furnace has been set so as to avoid these low hydrogen concentrations. The upper limit of the atmospheric pressure is determined based on the following reason. At a high pressure, a decrease in the flow rate of the inert gas such as argon gas on the surface of the melt makes it difficult to exhaust carbon or gaseous reaction products, where the carbon has degassed from the carbon heater or carbon parts of the furnace, and the gaseous reaction products include SiO evaporated from the silicon melt. As a result, carbon concentration in the crystal exceeds the preferable range. In addition, in an inside area of the furnace above the melt surface, the SiO agglomerates to areas having a temperature of about 1100° C. or less, generating dusts. Such dusts fall into the melt and cause dislocations to occur within the crystal. The above upper limit of atmospheric pressure within the furnace has been set so as to inhibit such phenomena.

The silicon is heated with the heater 2 and turned into a melt 3. A seed crystal mounted on a seed chuck 5 is immersed in the melt 3, and crystal pulling is carried out while rotating the crucible 1 and a pull shaft 4. The crystal orientation may be set to {100}, {111} or {110}. After necking down the seed to make the crystal dislocation free, a shoulder is formed and the crystal is grown to have the target body diameter of, for example, 210 mm.

The body is then grown to a length of perhaps 1200 mm at a constant pulling rate and tailing is carried out under normal conditions, after which crystal growth is brought to an end. Here, the pulling rate of the crystal is determined to have a preferable value based on a resistivity of the crystal, size of the silicon single crystal, or a hot zone structure (heat conditions) of the apparatus for pulling a silicon single crystal. The silicon single crystal may be pulled by a pulling rate for causing generation of a ring-like OSF region within the crystal. Therefore, the lower limit for the pulling rate may be determined to be a value allowing generation of a ring-OSF region provided that dislocation clusters do not occur at that rate. Therefore, there is no need for using a low pulling rate for pulling a defect-free crystal including no ring-OSF region. By the use of a high-pulling rate, it is possible to grow silicon single crystals at high productivity.

In order to determine the pulling rate at which a ring-OSF region occurs but no dislocation clusters occur, a preliminary experiment (an experiment for various pulling rates) is carried out, in which a body portion of silicon single crystal is grown while gradually decreasing the pulling rate. Subsequently, the crystal is vertically sectioned along the pull axis and distribution of ring-OSF region and other defect regions are examined using X-ray topography or the like. By this experiment, it is possible to determine the pulling rate range for pulling a crystal which has a ring-OSF region but is free of dislocation clusters.

Specifically, a body portion of a silicon single crystal is pulled while gradually decreasing the pulling rate. The single crystal is vertically sectioned along the pull axis so as to fabricate plate-like test pieces containing a portion near the pull axis. Copper decoration is then carried out in order to examine the distribution of COPs, dislocation clusters, and ring-OSF region. Each test piece is immersed in an aqueous copper sulfate solution, then air dried and subsequently heat treated in a nitrogen atmosphere at 900° C. for about 20 minutes. Next, to remove the copper silicide layer at the surface of the test piece, the test piece is immersed in a HF/HNO$_3$ mixed solution and several tens of microns of material at the surface layer is etched away. The position of the ring-OSF region on the test piece and the distribution of the various defect regions are then examined by x-ray topography. By this experiment it is possible to determine the pulling rate range for pulling a crystal which has a ring-OSF region but is free of dislocation clusters.

The position for generating a ring-OSF region is also dependent on a resistivity of the single crystal (diameter of the ring-OSF region decreases with decreasing resistivity). The above-described pulling experiment is carried out for each desired value of resistivity, and a pulling rate range for pulling a crystal which has a ring-OSF region but is free of dislocation clusters is determined preliminarily.

At the time of growing a p+ single crystal having a low resistivity of 0.025 to 0.008 Ω cm, generation of dislocation clusters is originally inhibited. Therefore, it is possible to grow a silicon single crystal including no dislocation clusters at a high pulling rate without controlling the thermal gradient of the crystal so that the thermal gradient at the center of the crystal is larger than the thermal gradient at the periphery of the crystal.

Next, a method for producing a silicon wafer is explained in the following.

After a silicon single crystal ingot has been obtained by the CZ method, the ingot undergoes conventional processing. The crystal is sliced into wafers with a cutter such as an internal diameter (ID) saw or a wire saw. After annealing of the sliced wafer (annealing step), the surface of the wafer is polished and cleaned (polishing step), and an epitaxial layer is grown on the surface of the wafer (epitaxial step). In addition to these operations, various other operations such as lapping, cleaning, and grinding or the like may also be carried out. Suitable changes in these processing operations may be made depending on the intended purpose, such as changes in the order of the operations or the omission of particular operations. The epitaxial step is not limited to a specific method. For example, it is possible to apply a well-known vapor growth method such as CVD (Chemical Vapor Deposition) method at ambient pressure. The epitaxial layer grown on the surface of the wafer may be a silicon epitaxial layer.

The annealing of the wafer is preferably a heat treatment of the wafer at a temperature of 700 to 900° C. for 30 minutes to 4 hours in a mixed gas atmosphere containing oxygen and an inert gas such as argon. By such annealing, it is possible to provide the silicon wafer with an intrinsic gettering (IG) effect.

An oxide film may be formed on the surface of the wafer during the annealing. However, it is not necessary to carry out HF treatment or the like for removing the oxide film from the surface of the wafer, since the oxide film on the surface of the wafer is removed by the polishing step subsequent to the annealing step.

In the present invention, as the Czochralski method (CZ method) for growing the silicon single crystal, a CZ method in which a magnetic field is not applied to the silicon melt may be used. Also, the CZ method may be a MCZ method in which a magnetic field is applied to the silicon melt.

In the present embodiment, since a silicon single crystal doped with carbon is grown in a hydrogen-bearing inert atmosphere, a multiplier effect can be obtained by narrowing the width of ring-OSF region existing within the crystal, and by reducing the epitaxial defects in a wafer at a portion corresponding to the position of the ring-OSF region. As a result, it is possible to obtain an inexpensive high-quality wafer having a resistivity of 0.025 to 0.008 Ω cm, in which epitaxial defects are extremely reduced in numbers.

Next, the effect of narrowing the width of a ring-OSF region by the addition of hydrogen to the inert atmosphere for crystal pulling is explained in the following.

Figure 2:
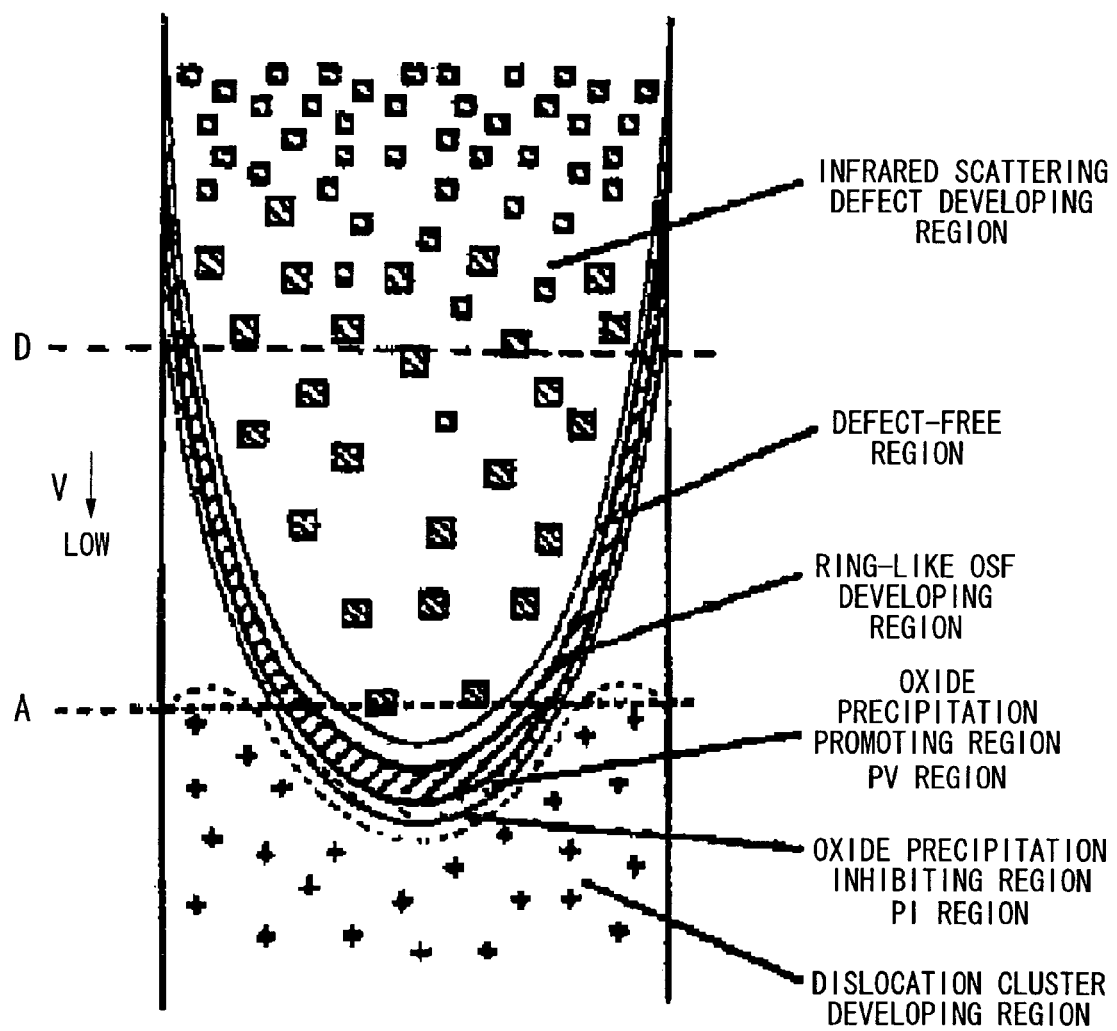
FIG. 2 is a defect distribution diagram in a longitudinal section of a single crystal grown while gradually decreasing the pulling rate. The diagram shows a case in which the thermal gradient Gc at the center of the crystal is smaller than the thermal gradient Ge at the periphery of the crystal.

FIG. 2 shows a defect distribution in a longitudinal cross section of a single crystal which is grown while gradually decreasing the pulling rate. In this case, thermal gradient in the crystal is controlled such that the thermal gradient Gc at the center of the crystal is smaller than the thermal gradient Ge at the periphery of the crystal. At a high pulling rate, the OSF developing region shows a ring-like distribution in a horizontal cross section of the crystal, and an infrared scattering defect developing region exists inside of the ring-OSF region. Infrared scattering defects are also called crystal originated particles (COPs). Oxide precipitation promotion region and oxide precipitation inhibiting region appear outside of the ring-like OSF developing region, where the oxide precipitation promoption region is a vacancy type region free of grown-in defects (PV region), and the oxide precipitation inhibiting region is an interstitial silicon type region free of grown in defects (PI region). Accompanied with decreasing pulling rate, diameter of the ring-OSF region decreases and dislocation cluster developing region appears.

Figure 3:
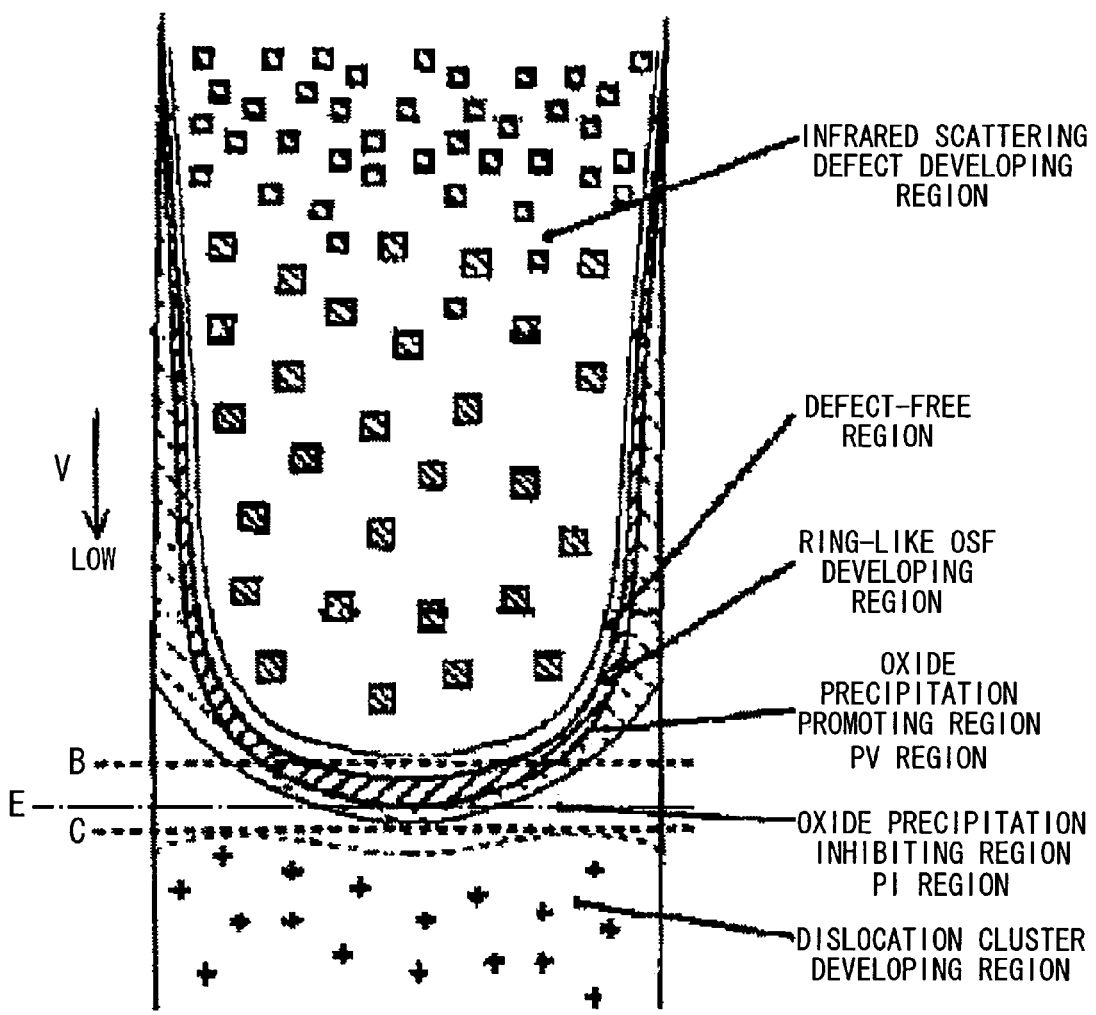
FIG. 3 is a defect distribution diagram in a longitudinal section of a single crystal grown while gradually decreasing the pulling rate. The diagram shows a case in which the thermal gradient Gc at the center of the crystal is the same as or larger than the thermal gradient Ge at the periphery of the crystal.

FIG. 3 shows a defect distribution in a longitudinal cross section of a single crystal grown while gradually decreasing the pulling rate. In this case, thermal gradient in the crystal is controlled such that the thermal gradient Gc at the center of the crystal is equal to or larger than the thermal gradient Ge at the periphery of the crystal. By the control of a hot-zone structure of the pulling furnace, a crystal after the solidification is provided with heat-insulation from outside of the crystal. By such a setting, as is shown in the comparison of FIG. 2 and FIG. 3, it is possible to control the thermal gradient Gc at the center of the crystal to be equal to or larger than the thermal gradient Ge at the periphery of the crystal.

Figure 4:
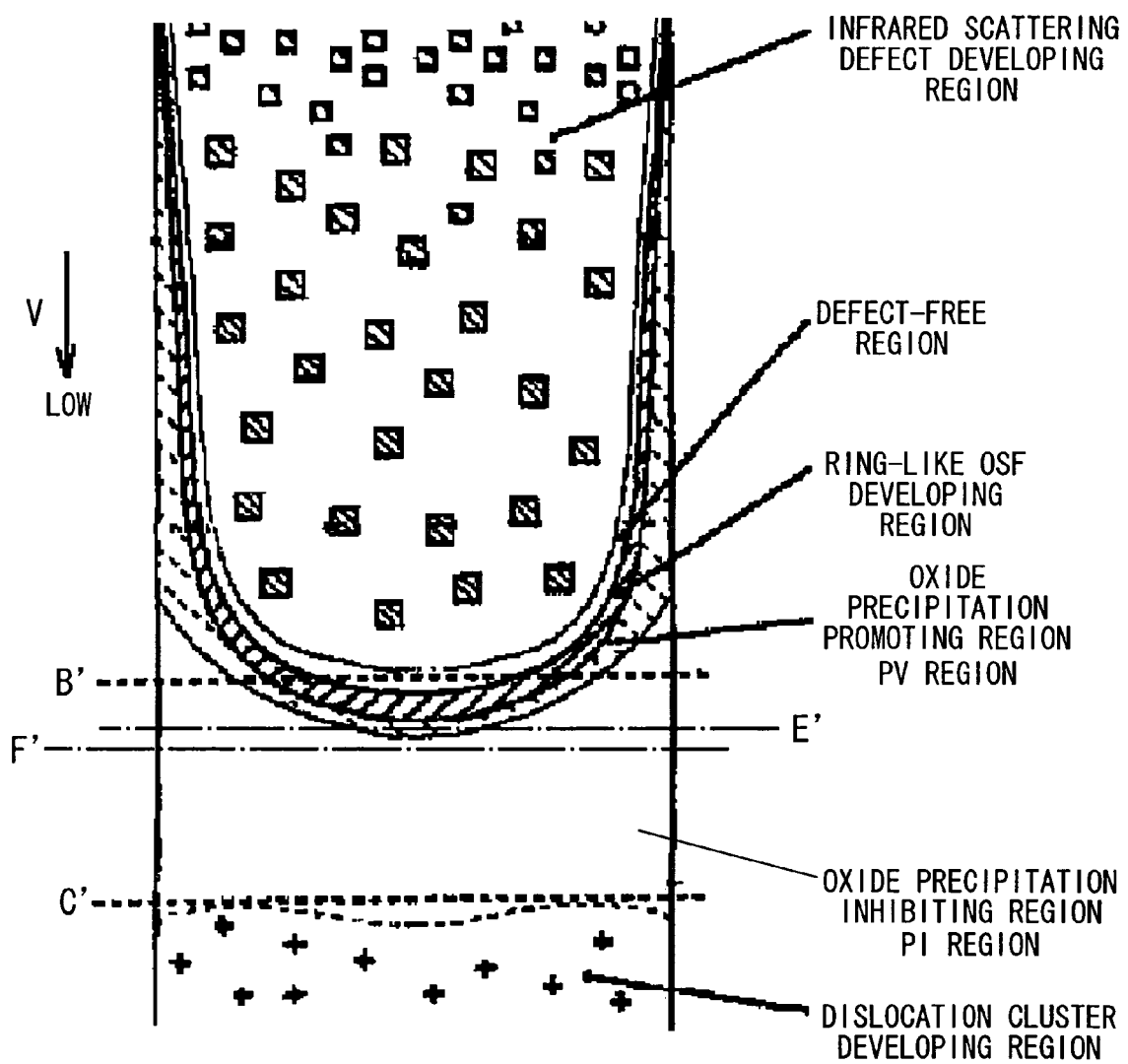
FIG. 4 is a defect distribution diagram in a longitudinal section of a single crystal grown while gradually decreasing the pulling rate. The diagram shows a case in which the thermal gradient Gc at the center of the crystal is the same as or larger than the thermal gradient Ge at the periphery of the crystal, and in which hydrogen has been added to the atmosphere in which the crystal is grown.

FIG. 4 shows a defect distribution in a longitudinal cross section of a single crystal which is grown while gradually decreasing the pulling rate. In this case, the thermal gradient in the crystal is controlled such that the thermal gradient Gc at the center of the crystal is equal to or larger than the thermal gradient Ge at the periphery of the crystal. The OSF developing region indicates a U-like shape in a longitudinal section of a crystal grown by pulling while gradually decreasing the pulling rate using a hot zone structure which is devised to control the thermal gradient in a crystal such that the thermal gradient Gc at the center of the crystal is equal to or larger than the thermal gradient Ge at the periphery of the crystal. At that time, by mixing a small amount of hydrogen in the inert gas that is introduced to the crystal pulling furnace, the pulling rate range for achieving a defect-free state is expanded in the axial direction of the crystal. This effect can be observed by comparing the range B-C in FIG. 3 for a crystal grown without hydrogen doping with the range B'-C' in FIG. 4 for a crystal grown in an atmosphere doped with hydrogen.

The expansion in the pulling rate range for obtaining a defect-free state due to doping of hydrogen is realized as a result of an increase in Vo and decrease in Vd, where Vo is the critical pulling rate at which the ring-like OSF-developing region vanishes at the center of the crystal, and Vd is the critical pulling rate at which dislocation clusters occur. Compared with the pulling rate range B-C in FIG. 3 for a case of not doping hydrogen, the pulling rate range B'-C' for obtaining a defect-free state shown in FIG. 4 expands toward the high-rate side (i.e., upward from B in FIG. 3) and toward the low-rate side (i.e., downward from C in FIG. 3). This effect is explained below while referring to FIG. 5.

Figure 5:
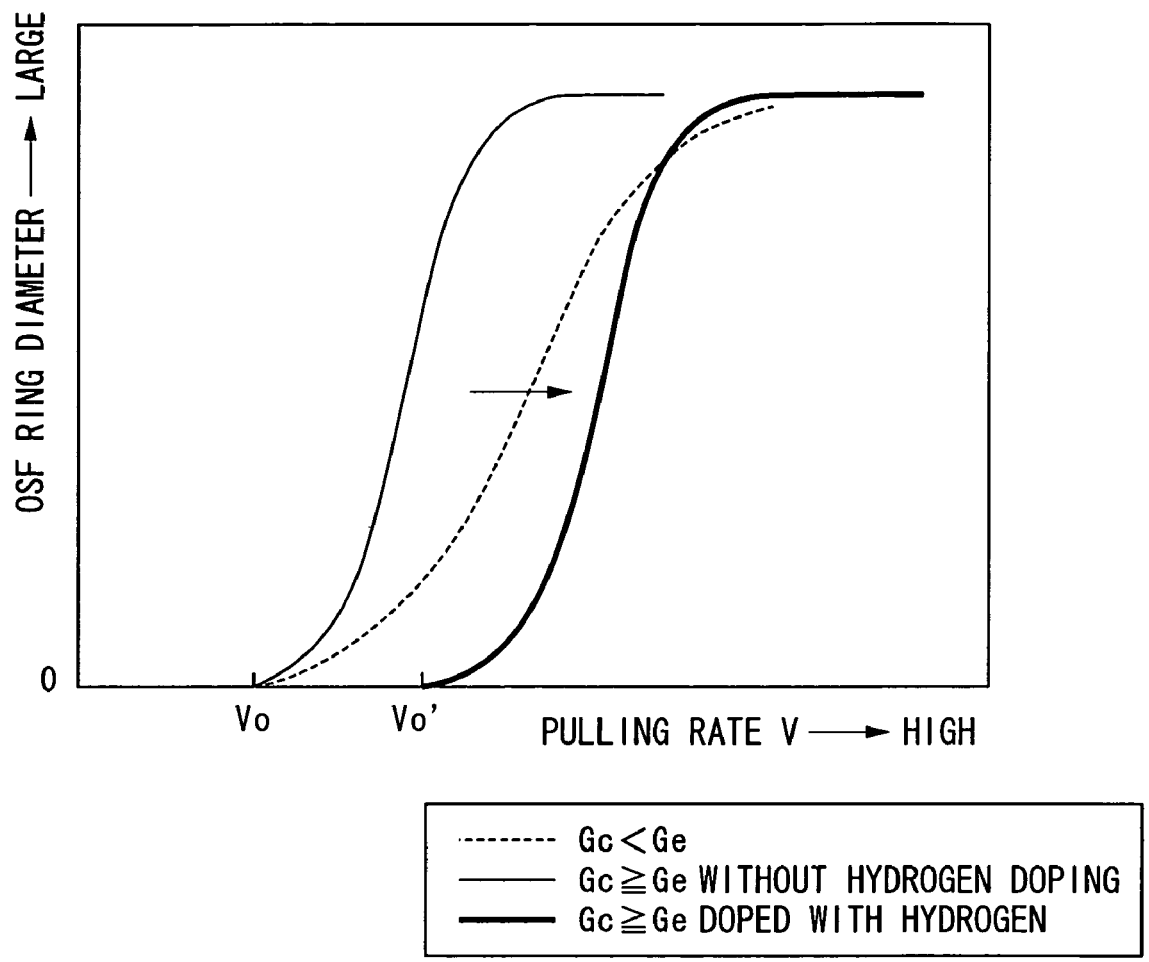
FIG. 5 is a graph showing the degree of influence by defect distribution on the relationship between the pulling rate and the ring-OSF region diameter.

FIG. 5 shows the influence by defect distribution on the relationship between the pulling rate and the ring-OSF region diameter. In this graph, the dashed line represents a case in which the thermal gradient Gc at the center of the crystal is smaller than the thermal gradient Ge at the periphery of the crystal. Here, the OSF-developing region in a longitudinal sectional view of a single crystal grown while gradually decreasing the pulling rate has a downwardly protruding, V-like shape. In this case, as the pulling rate decreases, the ring-OSF region diameter gradually shrinks, converging to 0 at the critical pulling rate Vo.

The thin solid line represents a case in which hydrogen is not doped, and the thermal gradient Gc at the center of the crystal is the same as or larger than the thermal gradient Ge at the periphery of the crystal. In a longitudinal sectional view of a single crystal grown while gradually decreasing the pulling rate, the shape of OSF-developing region shows a U-like shape. In this case, the pulling rate at which the ring-OSF region diameter starts to shrink is lowered, shrinkage occurs abruptly from the starting rate, and the pulling rate converges to 0 at substantially the same critical pulling rate Vo as in the case represented by the dashed line. That is, the gradient of decrease in the ring diameter is steepened while maintaining the same critical rate Vo. As a result, near the critical rate Vo, it is possible to grow a defect-free single crystal free of dislocation clusters or COPs throughout the radial direction of the crystal. Yet the pulling rate must be kept at a low rate because the critical rate Vo is not increased.

On the other hand, the thick solid line represents a case in which hydrogen is doped, and the thermal gradient Gc at the center of the crystal is the same as or larger than the thermal gradient Ge at the periphery of the crystal. In a longitudinal sectional view of a single crystal grown while gradually decreasing the pulling rate, the OSF-developing region has a U-like shape. In this case, compared with the fine solid line, the gradient of decrease in the ring diameter remains steep and the critical rate increases from Vo to Vo'. By being shifted toward the high pulling rate side, the fine solid line corresponds substantially to the thick solid line. In addition, in this case, the width of the ring-OSF region is narrowed.

Hence, by combining hydrogen doping with growth conditions of a crystal free of grown-in defects, it is possible to increase the critical rate at which the ring-like OSF region vanishes at the center of the crystal. Therefore, it is possible to grow, at a pulling rate higher than the conventional rate, a grown-in defect-free single crystal which, in the as-grown state, contains no dislocation clusters or COPs throughout the crystal in the radial direction thereof. Moreover, since the upper limit of the pulling rate at which dislocation clusters occur is lowered from Vd to Vd' by an effect of hydrogen doping, the pulling rate range for achieving a defect-free state is broadened from B-C to B'-C'. As a result, it is possible to grow a defect-free crystal stably, and remarkably increase the production yield of crystals free of grown-in defects.

The followings are the considerations regarding the cause for expanding the pulling rate range for achieving a grown-in defect-free crystal by the doping of hydrogen, i.e., the cause for increasing the critical pulling rate Vo for the ring-like OSF and decreasing the critical pulling rate Vd at which dislocation clusters develop.

When a silicon wafer is heat-treated in high temperature hydrogen at 1300 to 1390° C. and quenched, vacancies or interstitial silicon atoms react with hydrogen to form vacancy-hydrogen or interstitial silicon-hydrogen complexes (M. Suezawa: The Division of Crystal Science and Technology, The Japan Society of Applied Physics, 110$^{th}$ Workshop Text (Jun. 3, 1999), p. 11). Therefore, when a CZ crystal is grown in a hydrogen-bearing inert atmosphere, at temperatures higher than the temperatures for generating grown-in defects such as COPs (approx. 1100° C.) and dislocation clusters (approx. 1000° C.), vacancy-hydrogen complexes or interstitial silicon-hydrogen complexes are formed by reaction of hydrogen with the excess vacancies or excess interstitial silicon in the silicon crystal. Since the formation of complexes decrease the concentration of vacancy and interstitial silicon, aggregation of vacancies and interstitial silicon is inhibited. As a result, a CZ crystal is grown at a state in which COPs and dislocation clusters do not exist or have small size.

Figure 6:
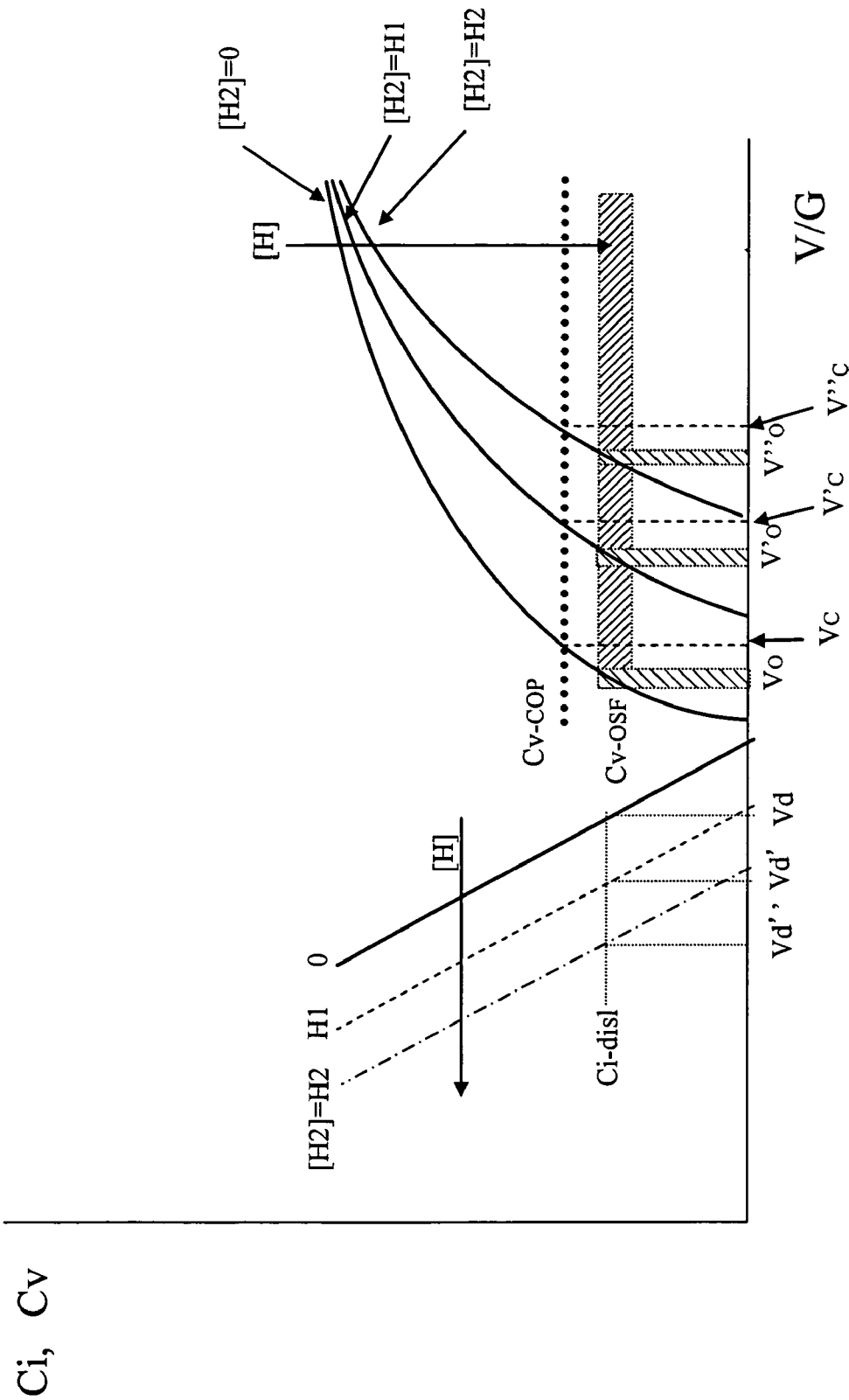
FIG. 6 shows the influence by V/G on concentration of point defects and conditions for generating various defect regions, and shows effects of hydrogen doping on shifting of critical V/G for forming defects.

FIG. 6 shows the relationship of Ci and Cv versus V/G at temperatures not lower than 1100° C. at the center of the crystal during CZ crystal growth, where Cv is a concentration of vacancies; Ci is a concentration of interstitial silicon; and V/G is a ratio of the pulling rate V to the thermal gradient G on the crystal side in the vicinity of the solid-liquid interface. The graph illustrates the effect of inhibiting the occurrence of COPs and dislocation clusters in crystals containing hydrogen. In the following, the process for inhibiting the formation of COPs and dislocation clusters is explained with reference to the graph. Here, Vo, Vc and Vd represent respectively the critical pulling rates at which the ring-OSF region, COPs and dislocation clusters begin to occur at the center of the crystal or in a portion of the crystal in the radial direction thereof. Cv-OSF, Cv-COP and Ci-dis1 represent respectively the critical concentrations of a point defect, at which the ring-OSF region, COPs and dislocation clusters occur.

When a crystal is grown in an atmosphere not added (doped) with hydrogen using a CZ furnace having a hot zone, so as to grow a grown-in defect-free crystal, designed to control the V/G ratio to satisfy Gc≧Ge in the radial direction of the crystal, generally COPs occur in the crystal at a pulling rate higher than Vc (the case in which [H2]=0 in FIG. 6). COPs are excess vacancy type point defects. However, when a CZ crystal is grown in a hydrogen-bearing atmosphere (cases H1 and H2 in FIG. 6), concentration of free vacancies is decreased by the formation of complexes of vacancies and hydrogen.

The decrease in the concentration of free vacancies depends on the hydrogen concentration in the crystal, and the vacancy concentration decrease with increasing hydrogen concentration in the crystal. Hence, under the presence of hydrogen, the pulling rate for ring-OSF region formation shifts from Vo to the high rate value, such as Vo' or Vo", and the pulling rate for COP formation also shifts from Vc to the high rate value, such as Vc' or Vc".

On the other hand, in a case in which a CZ crystal is grown in an atmosphere not doped with hydrogen (the case in which [H2]=0 in FIG. 6), when the pulling rate is smaller than Vd, excess interstitial silicon type point defects are caused to occur, the interstitial silicon concentration satisfies Ci>Ci-dis1, and dislocation clusters generally occur as secondary defects caused by the interstitial silicon. However, when the crystal is grown in a hydrogen-bearing atmosphere ([H2]=H1 or H2 in FIG. 6), the concentration of free interstitial silicon is lowered by the formation of complexes of the interstitial silicon and the hydrogen. Therefore, the pulling rate for forming dislocation clusters shifts from Vd to the low rate value, such as to Vd' or Vd", corresponding to the critical concentration Ci-dis1.

As shown in [H2]=H1 or H2 in FIG. 6, under a relatively low hydrogen concentration, at a sufficiently large V/G, COP formation is not completely inhibited since the concentration of vacancies exceeds the critical concentration Cv-COP for forming COPs. However, because the vacancy concentration is lower than that in the hydrogen-free condition, COPs are smaller in size.

In a crystal pulled at a rate not higher than the critical rate Vo' or Vo" for ring-like OSF formation and not lower than the critical rate Vd' or Vd" for dislocation cluster formation, the vacancy and interstitial silicon have sufficiently low concentrations so that COPs and dislocation clusters do not occur in the crystal. Furthermore, because the pulling rate range (margin) for a grown-in defect-free crystal is remarkably larger than the case not doped with hydrogen, it is possible to grow defect-free crystals stably at high yield.

When the V/G ratio is larger than the critical V/G condition for closing the ring-OSF region but close to the critical condition, the ring OSF does not close at the center of the crystal and so COPs occur within the portion inside the ring. Yet, because the vacancy concentration decreases due to hydrogen doping, the COPs are of a small size. In addition, the width of the ring-OSF region is narrowed.

At a pressure of 4.0 to 9.33 kPa (30 to 70 torr) within the furnace, the hydrogen concentration in the above-described inert atmosphere can be set to not less than 3% and not more than 20%. It is desirable for the pressure of the atmosphere within the furnace to be not less than 1.33 kPa (10 torr), preferably from 4.0 to 26.7 kPa (30 to 200 torr), and more preferably from 4.0 to 9.3 kPa (30 to 70 torr). If the partial pressure of hydrogen is low, the hydrogen concentration within the melt and the crystal will be low. The above lower limit in atmospheric pressure has been set so as to avoid these low hydrogen concentrations. A decrease in the flow rate of inert gas (e.g. argon) makes it more difficult to exhaust carbon or gaseous reaction products from furnace. The carbon is degassed from the carbon heater or carbon parts, and gaseous reaction products include SiO that have been vaporized from the melt. As a result, the carbon concentration in the crystal exceeds the preferable value. In addition, in inside area of the crucible above the melt surface, SiO agglomerates at a portion at which temperature is about 1100° C. or less and generates dusts. Such dusts fall into the melt and cause dislocations to occur within the crystal. The above upper limit of atmospheric pressure within the furnace has been set so as to inhibit such a phenomena. A partial pressure of the atmosphere within the furnace is preferably not lower than 40 Pa and not higher than 400 Pa.

The hydrogen concentration in the silicon single crystal during growth in a hydrogen-bearing inert atmosphere can be controlled through the hydrogen partial pressure within the atmosphere. Hydrogen within the atmosphere dissolves in the silicon melt and reaches a steady (equilibrium) state, and the hydrogen concentrations within the liquid and solid phases are distributed by segregation of concentration at the time of solidification of a crystal. As a result, hydrogen is introduced into the crystal.

According to Henry's law, the hydrogen concentration within the melt is dependent on the hydrogen partial pressure within the gas phase and is expressed as:

$$P_{H2}=kC_{LH2},$$

where $P_{H2}$ is the hydrogen partial pressure in the atmosphere, $C_{LH2}$ is the hydrogen concentration in the silicon melt, and k is a coefficient between the $P_{H2}$ and $C_{LH2}$.

The hydrogen concentration in the silicon single crystal is determined by the relationship between the hydrogen concentration in the melt and segregation, and is expressed as:

$$C_{SH2}=k'C_{LH2}=(k'/k)P_{H2},$$

where $C_{SH2}$ is the hydrogen concentration in the crystal, and k' is the segregation coefficient for hydrogen between the silicon melt and the silicon crystal.

As shown by the above formulas, the hydrogen concentration in the crystal just after solidification can be controlled to a desired constant concentration in the axial direction of the crystal by controlling the hydrogen partial pressure within the atmosphere.

In such a method for growing a silicon single crystal, the silicon single crystal is pulled in a hydrogen-bearing inert atmosphere. Using such a method, it is possible to expand the PI region pulling rate range for pulling a single crystal which is free of COPs or dislocation clusters throughout the radial direction and which is composed entirely of an interstitial silicon-rich region (PI region). As a result, the straight body portion of the single crystal can be made an interstitial silicon-rich region (PI region) which contains no dislocation clusters. In addition, it is possible to narrow the width of ring-OSF region. Conventionally, the PI region pulling rate has had to be set within a very narrow range for pulling a single crystal free of grown-in defects. In the invention, by expanding the range of the PI region pulling rate, it is possible to grow a single crystal free of grown-in defect easily at a pulling rate faster than the conventional rate. Moreover, in a case of pulling a silicon single crystal using conditions by which an OSF developing region generated in the crystal shows a ring-like distribution in the radial direction of the crystal, it is possible to reduce the influence of the ring-OSF region by narrowing the width of the ring-OSF region.

Here, comparison of the PI region pulling rate range in a hydrogen-bearing atmosphere with the PI region pulling rate range in a hydrogen-free inert atmosphere is made under conditions in which the axial thermal gradient G within the crystal immediately after solidification is in a constant and unchanging state.

Figure 7:
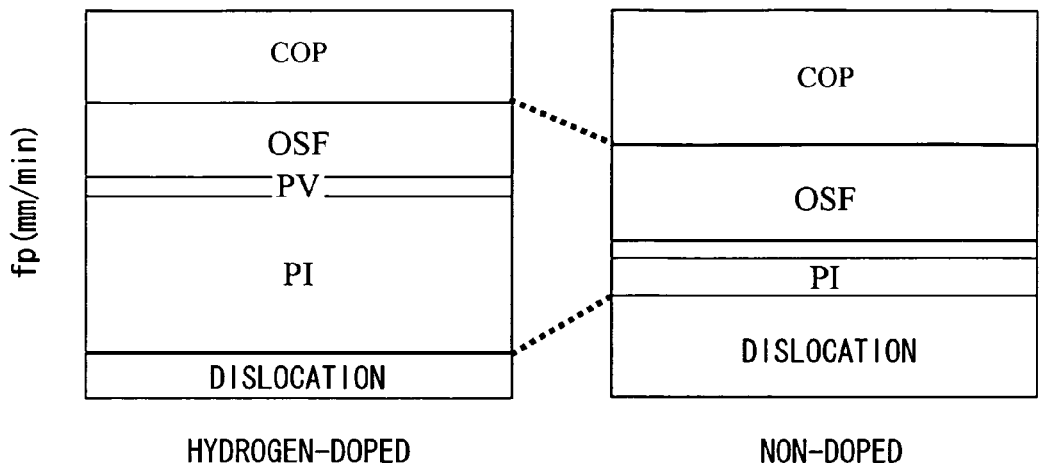
FIG. 7 is a schematic diagram showing the changes in the pulling rate region due to hydrogen doping.

Specifically, by pulling the silicon single crystal in a hydrogen-bearing atmosphere, the PI region pulling rate range (margin) for pulling a grown-in defect-free single crystal composed of a region (PI region) free of interstitial silicon-type grown-in defects can be expanded to at least 4 times, and as shown in FIG. 7, even 4.5 times as large, as the margin for pulling a single crystal in an atmosphere containing no hydrogen. By pulling a single crystal using such a pulling rate range, it is possible to pull a single crystal of desired quality.

In this case, it is also possible to shrink the ring-like OSF-developing region. The size of the PV region (vacancy-type region free of grown-in defect) does not change by the doping of hydrogen.

As is described above, in the present invention, by the hydrogen doping in the atmosphere for crystal pulling, it is possible to shrink the OSF developing region and narrow the width dimension of the ring-OSF region in a single crystal. In addition, by the doping of carbon, it is possible to reduce the influence of the ring-OSF region on a wafer sliced from the wafer. Therefore, by the multiplier effect of hydrogen doping and carbon doping, in a wafer on which an epitaxial layer is grown, it is possible to reduce generation of defects caused by the presence of a ring-OSF region. In addition, it is possible to pull a single crystal having the above-described desirable quality, enhance the working efficiency, and thereby remarkably reduce the production cost of silicon single crystals and silicon wafers sliced from the single crystals.

Next, the procedure for setting the operating conditions for growing a silicon single crystal in an atmosphere doped with hydrogen is explained.

Firstly, by the use of CZ furnace shown in FIG. 1, in the same manner as the first embodiment, polycrystalline silicon of high purity is loaded in a crucible and dopant is added so that a resistivity of a crystal pulled from the silicon melt is 0.025 to 0.008 Ωcm. The interior of the pulling apparatus is controlled by an inert atmosphere of reduced pressure of 1.33 to 13.3 kPa (10 to 100 torr). In order to determine the hydrogen concentration and pulling rate range for growing a crystal in a desirable state, hydrogen is introduced into the furnace at mixing ratios of 0, 0.1, 3, 5, 8 and 10 vol % in an inert gas (argon gas or the like).

Next, as in the first embodiment, a seed crystal is immersed in the silicon melt 3 and a single crystal is pulled from the melt. When the crystal body has reached a length of 300 mm, for example, the pulling rate is adjusted to a rate, such as 1.0 mm/min, that is sufficiently higher than the critical rate. Next, the pulling rate is lowered in a substantially linear manner in accordance with the pull length so that the pulling rate falls below the critical rate, to 0.3 mm/min for example, once the body has reached a length of, say, 600 mm. The body is then grown at this pulling rate to a length of, for example, 1200 mm, and tailing is carried out under normal conditions, after which crystal growth is brought to an end.

Single crystals that have been grown under different hydrogen concentrations are vertically sectioned along the pull axis so as to fabricate plate-like test pieces containing a portion near the pulling axis. Copper decoration is then carried out in order to examine the distribution of grown-in defects and ring-OSF region. First, each test piece is immersed in an aqueous copper sulfate solution, then air dried and subsequently heat treated in a nitrogen atmosphere at 900° C. for about 20 minutes. Next, to remove the copper silicide layer at the surface of the test piece, the test piece is immersed in a HF/HNO$_3$ mixed solution and several tens of microns of material at the surface layer is etched away. The position of the ring-OSF region on the test piece and the distribution of the various defect regions are then examined by x-ray topography. Also, the COP density in this test piece may be examined by a suitable technique such as the OPP method, and the dislocation cluster density may be examined by a Secco etching method.

In a crystal grown using an apparatus for pulling a single crystal which can satisfy a relationship Gc/Ge≧1, defect distribution in a longitudinal section of the crystal shows an occurrence of a ring-like OSF region of U-shape as shown in FIG. 3. As the hydrogen concentration increases, the defect-free region expands in the manner of B'-C' in FIG. 4, enlarging the pulling rate range (margin) for obtaining a defect-free crystal.

The grown-in defect free region for a single crystal composed of an oxide precipitation promotion region (PV region) which is a vacancy type region free of grown-in defects and a interstitial silicon type region (PI region) free of grown-in defect is represented by E'-C' in FIG. 4. As represented by F'-C' in FIG. 4, the present embodiment expands the pulling rate range for the interstitial silicon-rich region, which is a pulling rate range for pulling grown-in defect-free single crystals composed entirely of a PI region. Specifically, as shown in FIG. 7, the pulling rate margin for PI region in this case is at least 4 times larger than that for the case in which an atmospheric condition for crystal pulling contains no hydrogen.

Figure 8:
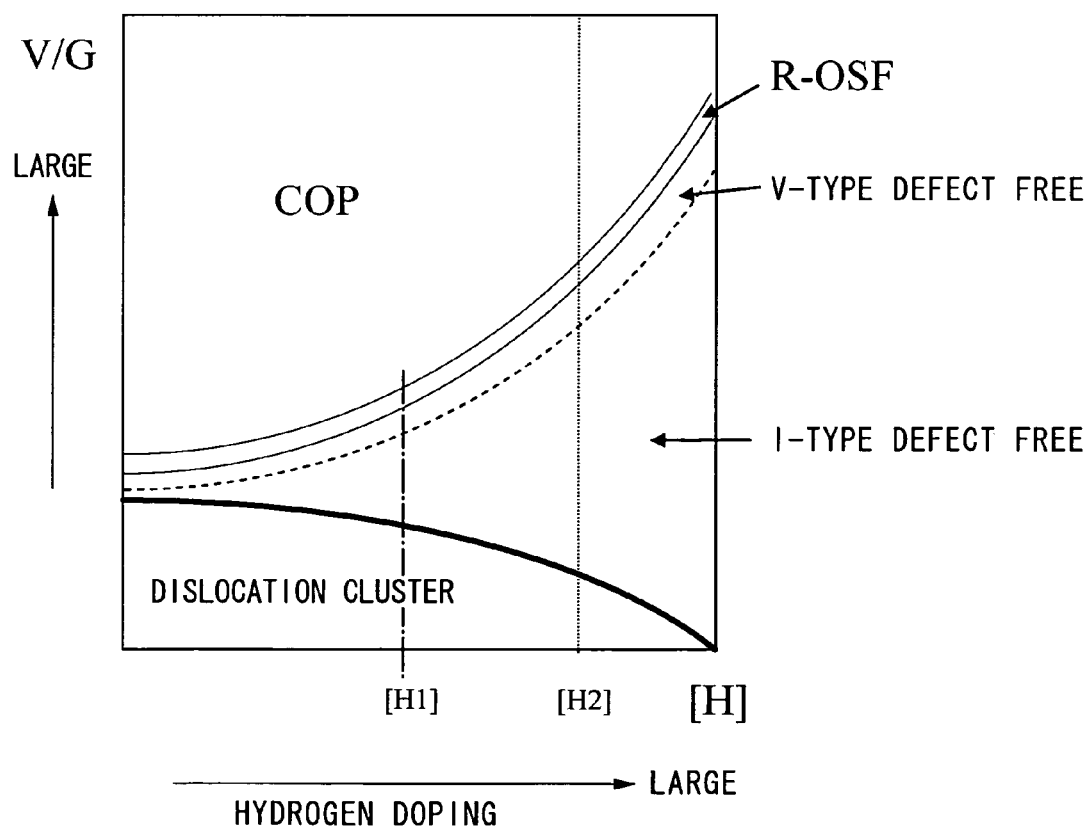
FIG. 8 is a graph illustrating the various defect developing regions in terms of the relationship between V/G and hydrogen concentration. An expansion of the V/G region for defect formation due to hydrogen doping can be observed.

By carrying out the above-described pulling experiments, it is possible to determine the relationship (FIG. 8) between the V/G ratio and the hydrogen concentration for various defect regions such as COP region, ring-OSF region region, V-type grown-in defect-free region (PV region), I-type grown-in defect-free region (PI region), and dislocation cluster region respectively.

Moreover, in carrying out such experiments, pulling rates are changed for several deferent portions such as from 300 mm to 600 mm, from 500 mm to 800 mm, and from 700 mm to 1000 mm. As a result, the relationship between the pulling rate range (margin) for obtaining a grown-in defect-free crystal and the axial position on the crystal (FIG. 9) can be determined. The operating conditions for obtaining a grown-in defect-free single crystal can be selected from FIG. 9.

Next, a method for producing a wafer is explained in the following.

Figure 9:
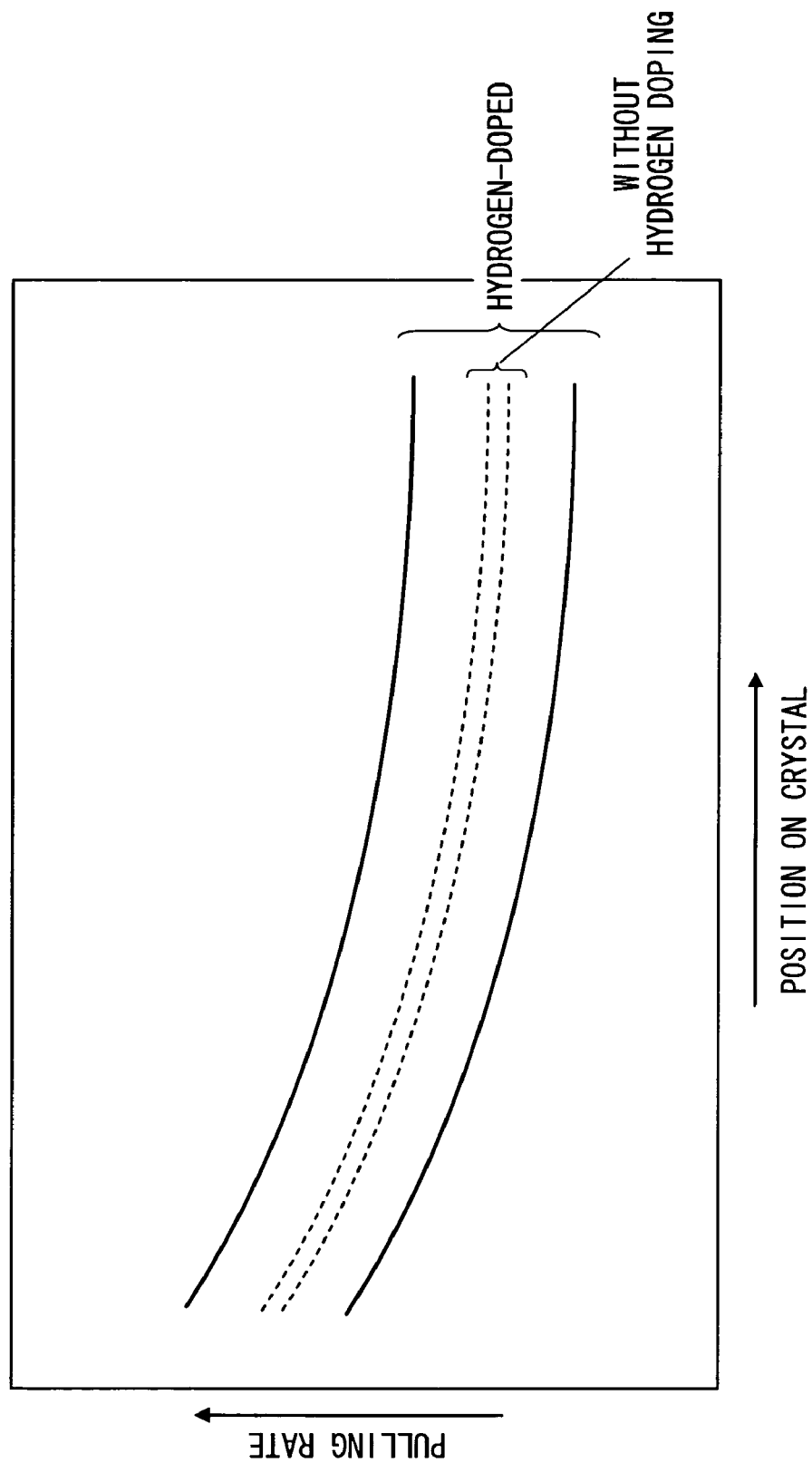
FIG. 9 is a graph showing the relationship between a position in a crystal and the pulling rate range (margin) at which a grown-in defect-free region can be obtained.

By setting the pulling rate within the pulling rate range indicated by the solid lines in FIG. 9 at the corresponding crystal positions, an ingot of a single crystal can be grown which is completely free of grown-in defects throughout the whole portion from top to bottom. Corresponding to this setting, it is possible to grow a single crystal in which the crystals is greatly improved. This effect can be observed in FIG. 9, where a dashed line indicates the pulling rate range in the prior art not adding hydrogen, and the solid line indicates the range of the present invention. In addition, even when a ring-OSF region occurs in the crystal, by the decrease of width of the ring-OSF region, production yield is largely enhanced.

By such settings for operation conditions of CZ crystal growth, ingots of silicon single crystal having desirable quality can be obtained. From those ingots, wafers may be obtained in the same manner as the first embodiment.

In the present embodiment, silicon single crystals are pulled in a hydrogen-bearing inert atmosphere from a melt doped with dopant such that a resistivity in the crystal is 0.025 to 0.008 Ω cm. By this method, it is possible to grow a single crystal having a ring-OSF region of a small ring width at a desirable position. Therefore, very easily at a higher pulling rate than the conventional pulling rate, it is possible to grow silicon single crystals which are capable of providing silicon wafers having a resistivity of 0.025 to 0.008 Ω cm, and generating epitaxial defects in reduced number at the time of growing epitaxial layers on the wafers.

EXAMPLES

Samples 1 to 7

Polycrystalline silicon of high purity was loaded in a crucible and boron was added so that a resistivity of a crystal was 0.014 to 0.010 Ωcm. Argon gas mixed with hydrogen at mixing ratios of 0, 1.5, 3, 8 and 10 vol % was introduced in the furnace. Ingots of p type silicon single crystal having an orientation of (100) and a diameter of 8 inches were grown at a growth rate of 1 mm/min. Silicon wafers of sample 1 to sample 7 were obtained from the ingots of silicon single crystals grown in accordance with the above-described process. After annealing the silicon wafers of sample 1 to sample 7 at 1100° C. for 16 hours in an oxidizing atmosphere, surfaces of the wafers were observed using an optical microscope for examining the width of the ring-like OSF region generated in the samples of the wafer. The results are shown in Table 1.

TABLE 1

| Sample | Resistivity (Ωcm) | Concentration of $H_2$ (Vol %) | Concentration of carbon (atoms/cm$^3$) | Width of Ring-OSF region (mm) | Total number of epitaxial defects in 25 wafers | Heat treatment (850° C. 1 hr) before epitaxial step | BMD density after heat treatment at 1000° C. for 16 hr (nuclei/cm$^2$) |
|---|---|---|---|---|---|---|---|
| 1 | 0.012 | 0 | non-doped | 12.5 | 76 | not treated | <1e4 |
| 2 | 0.012 | 0 | non-doped | 12.0 | 874 | treated | 7.8e6 |
| 3 | 0.014 | 1.5 | non-doped | 7.3 | 36 | not treated | <1e4 |
| 4 | 0.013 | 3 | non-doped | 5.4 | 5 | not treated | <1e4 |
| 5 | 0.012 | 8 | non-doped | <3 | 6 | not treated | <1e4 |
| 6 | 0.010 | 10 | non-doped | <3 | 4 | not treated | <1e4 |
| 7 | 0.012 | 8 | non-doped | <3 | 5 | treated | 5.6e6 |
| 8 | 0.013 | 0 | 3.8e15 | 13.7 | 52 | not treated | <1e4 |
| 9 | 0.014 | 0 | 2.1e16 | 12.5 | 7 | not treated | <1e4 |
| 10 | 0.014 | 0 | 3.7e16 | 12.5 | 9 | treated | 8.9e6 |
| 11 | 0.012 | 5.5 | 7.8e16 | <3 | 4 | not treated | <1e4 |
| 12 | 0.012 | 5.5 | 9.8e16 | <3 | 10 | treated | 8.1e6 | ring-OSF region is positioned at a desirable radial position throughout the whole portion from top to bottom of the crystal.

Moreover, by hydrogen doping, the pulling rate range (margin) for a grown-in defect-free crystal can be remarkably expanded, and the production yield of grown-in defect-free Samples 8 to 12

Polycrystalline silicon of high purity was loaded in a crucible and boron was added so that a resistivity of a crystal was 0.014 to 0.010 Ωcm. Carbon was added to the melt so that silicon single crystals had carbon concentrations of $3.8 \times 10^{15}$ to $9.8 \times 10^{16}$ atoms/cm$^3$. Argon gas mixed with hydrogen at mixing ratios of 0 and 5.5 vol % was introduced in the furnace. Ingots of p type silicon single crystal having an orientation of (100) and a diameter of 8 inches were grown at a growth rate of 1 mm/min. Silicon wafers of sample 8 to sample 12 were obtained from the ingots of silicon single crystals grown in accordance with the above-described process.

After annealing the silicon wafers of sample 8 to sample 12 at 1100° C. for 16 hours in an oxidizing atmosphere, surfaces of the wafers were observed using an optical microscope for examining the widths of the ring-OSF region generated in the samples of the wafer. Concentrations of boron and carbon in the samples were analyzed using a secondary ion mass spectroscope (SIMS). The results are shown in Table 1.

On surfaces of silicon wafers of sample 1, sample 3 to sample 6, sample 8, sample 9, and sample 11, $SiHCl_3$ was supplied using hydrogen as a carrier gas, and a silicon epitaxial layer of 6 μm in thickness and 2 Ω cm in resistivity was grown at a temperature of 1150° C. After that, using an apparatus for examining surface defects (SP-1 produced by KLA-Tencor Corporation), numbers of epitaxial defects were examined on each wafer. For each sample, epitaxial defects were counted from 25 wafers. The results are shown in Table 1.

Silicon wafers of sample 2, sample 7, sample 10, and sample 12 were annealed in a mixed gas atmosphere of oxygen and argon at 850° C. for 1 hour. After the annealing, an epitaxial layer was grown on the surface of each wafers in the same manner as sample 1. After that, the occurrence of epitaxial defects was examined in the same manner as sample 1. The results are indicated in Table 1.

Moreover, the silicon wafers of samples 1 to 12, having epitaxial layers were annealed at 1000° C. for 16 hours. The wafers were subjected to selective etching with an etchant for light-etching. After that, the density of etch pits on each wafer was examined using an optical microscope, thereby the density of oxide precipitates (bulk micro defects: BMDs) was examined. In that measurement, the density of etch pits was measured from a central portion, a portion which is distant from the wafer center by a half length of the wafer radius, and a peripheral portion, and BMD density was determined as an average value of the result of measurement from the above-described three different portions. The results are indicated in Table 1.

From the results shown in Table 1, it was confirmed that widths of the ring-OSF regions in silicon single crystals which had been grown in a hydrogen-bearing inert atmosphere were narrower than the widths of ring-OSF regions in silicon single crystals which had been grown in an inert atmosphere not containing hydrogen. In addition, it was confirmed that the widths of ring-OSF regions in silicon single crystals which had been grown in an inert atmosphere containing 3 volume % of hydrogen are extremely narrower than widths of ring-OSF regions in silicon single crystals which had been grown in an inert atmosphere containing 1.5 volume % of hydrogen. In all the samples, the ring-like OSF region was positioned such that distance from the center of the wafer was 45 to 63 mm. That is, the distance of the ring-like OSF region from the center of the wafer in radial direction was nearly half the wafer radius.

From the results shown in Table 1, it was confirmed that numbers of epitaxial defects in silicon wafers sliced from silicon single crystals which have been grown in a hydrogen-bearing inert atmosphere are smaller than numbers of epitaxial defects in silicon wafers sliced from silicon single crystals which have been grown in an inert atmosphere not containing hydrogen.

From the results shown in Table 1, it can be understood that wafers which had been subjected to annealing at 850° C. for 1 hour before the epitaxial step had a higher density of oxide precipitaes (BMDs) compared to the wafers which had not been subjected to the annealing before the epitaxial step.

From the results shown in Table 1, it was confirmed that numbers of epitaxial defects of silicon wafers sliced from silicon single crystals which had been grown while doping carbon were smaller than numbers of epitaxial defects in silicon wafers sliced from silicon single crystal grown without carbon doping.

In addition, it was confirmed that silicon single crystals doped with carbon, which had been grown in a hydrogen-bearing inert atmosphere had an extremely narrow width of ring-OSF region and were capable of providing epitaxial wafers having epitaxial defects in reduced numbers, compared to the silicon single crystals grown without carbon doping in an inert atmosphere not containing hydrogen.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for growing a silicon single crystal by the Czochralski method, comprising:
    adding hydrogen to an inert atmosphere in which a silicon single crystal is grown;
    adding dopant to silicon melt such that the silicon single crystal which is pulled from the melt has resistivity of 0.025 to 0.008Ωcm; and
    pulling the silicon single crystal from the silicon melt, wherein a rate of pulling the silicon single crystal is controlled in a range such that the silicon single crystal is free of dislocation clusters but has a ring-likely distributed oxidation-induced stacking fault developing region and an oxide precipitation promotion region, and
    the ring-likely distributed oxidation-induced stacking fault developing region has a width of less than 3 mm.

2. A method for growing a silicon single crystal by the Czochralski method, comprising:
    adding hydrogen into an inert atmosphere in which a silicon single crystal is grown;
    adding dopant such that the silicon single crystal which is pulled from the melt has resistivity of 0.025 to 0.008Ωcm;
    adding carbon into the silicon melt; and
    pulling the silicon single crystal from the silicon melt, wherein a rate of pulling the silicon single crystal is controlled in a range such that the silicon single crystal is free of dislocation clusters but has a ring-likely distributed oxidation-induced stacking fault developing region and an oxide precipitation promotion region, and
    the ring-likely distributed oxidation-induced stacking fault developing region has a width of less than 3 mm.

3. A method for growing a silicon single crystal in accordance with claim 1, wherein 3 to 20 volumetric % of hydrogen is added to the inert atmosphere in which the silicon single crystal is grown.

4. A method for growing a silicon single crystal in accordance with claim 2, wherein 3 to 20 volumetric % of hydrogen is added to the inert atmosphere in which the silicon single crystal is grown.

5. A method for growing a silicon single crystal in accordance with claim 2, wherein the dopant is added to the melt such that concentration of the carbon in the silicon single crystal grown from the melt is $5\times10^{15}$ to $5\times10^{17}$ atoms/cm3 based on measurement in accordance with ASTM F123-1981.

6. A silicon wafer which is doped with hydrogen, has a resistivity of 0.025 to 0.008Ωcm, and has an oxygen concentration in a range from $1.0\times10^{18}$ to $1.4\times10^{18}$ atoms/cm³ based on measurement in accordance with ASTM F121-1979,
wherein the silicon wafer is sliced from the silicon single crystal which is grown by the method of growing a silicon single crystal in accordance with claim 1, the silicon wafer is free of dislocation clusters but has a ring-likely distributed oxidation-induced stacking fault developing region and an oxide precipitation promotion region, and
the ring-likely distributed oxidation induced stacking fault developing region generated in the wafer has a width of less than 3 mm.

7. A silicon wafer which is doped with hydrogen, has a resistivity of 0.025 to 0.008Ωcm, and has an oxygen concentration in a range from $1.0\times10^{18}$ to $1.4\times10^{18}$ atoms/cm³ based on measurement in accordance with ASTM F121-1979, wherein the silicon wafer is sliced from the silicon single crystal which is grown by the method of growing a silicon single crystal in accordance with claim 2, the silicon wafer is free of dislocation clusters but has a ring-likely distributed oxidation-induced stacking fault developing region and an oxide precipitation promotion region, and
the ring-likely distributed oxidation induced stacking fault developing region generated in the wafer has a width of less than 3 mm.

8. A silicon wafer which is produced by growing an epitaxial layer on the silicon wafer of claim 6.

9. A silicon wafer which is produced by growing an epitaxial layer on the silicon wafer of claim 7.

10. A silicon wafer in accordance with claim 8 or 9, wherein concentration of oxygen in the wafer is $1.0\times10^{18}$ to $1.4\times10^{18}$ atoms/cm³ based on measurement in accordance with ASTM F121-1979.

11. A method for producing a silicon wafer, comprising:
slicing a silicon wafer from a silicon single crystal which has been grown by a method for growing a silicon single crystal in accordance with claim 1;
performing annealing of the silicon wafer at a temperature of 700 to 900° C. for 30 minutes to 4 hours;
after the annealing of the silicon wafer, performing polishing of a surface of the silicon wafer; and
after the polishing of the wafer, growing an epitaxial layer on the surface of the silicon wafer.

12. A method for producing a silicon wafer, comprising:
slicing a silicon wafer from a silicon single crystal which has been grown by a method for growing a silicon single crystal in accordance with claim 2;
performing annealing of the silicon wafer at a temperature of 700 to 900° C. for 30 minutes to 4 hours;
after the annealing of the wafer, performing polishing of a surface of the silicon wafer; and
after the polishing of the wafer, growing an epitaxial layer on the surface of the silicon wafer.

13. A method for growing a silicon single crystal in accordance with claim 1, wherein 3 to 10 volumetric % of hydrogen is added to the inert atmosphere in which the silicon single crystal is grown.

14. A method for growing a silicon single crystal in accordance with claim 2, wherein 3 to 10 volumetric % of hydrogen is added to the inert atmosphere in which the silicon single crystal is grown.

15. A method for growing a silicon single crystal in accordance with claim 1, wherein the dopant comprises a p-type dopant selected from boron, aluminum and germanium.

16. A method for growing a silicon single crystal in accordance with claim 2, wherein the dopant comprises a p-type dopant selected from boron, aluminum and germanium.

17. A silicon wafer according to claim 7, wherein the silicon wafer has a carbon concentration in a range from $5\times10^{15}$ to $5\times10^{17}$ atoms/cm³ based on measurement in accordance with ASTM F123-1981.

18. A method for growing a silicon single crystal according to claim 1, wherein the ring-likely distributed oxidation-induced stacking fault developing region is positioned such that a distance from the center of the crystal is 45 to 63 mm.

19. A method for growing a silicon single crystal according to claim 2, wherein the ring-likely distributed oxidation-induced stacking fault developing region is positioned such that a distance from the center of the crystal is 45 to 63 mm.

20. A silicon wafer according to claim 6, wherein the ring-likely distributed oxidation-induced stacking fault developing region is positioned such that a distance from the center of the wafer is 45 to 63 mm.

21. A silicon wafer according to claim 7, wherein the ring-likely distributed oxidation-induced stacking fault developing region is positioned such that a distance from the center of the wafer is 45 to 63 mm.

* * * * *